United States Patent
Peng et al.

(10) Patent No.: US 12,505,866 B2
(45) Date of Patent: Dec. 23, 2025

(54) UNDERLYING TRANSISTOR CIRCUIT OF SEMICONDUCTOR MEMORY AND PREPARATION METHOD FOR THE SAME

(71) Applicant: CHENGDU PBM TECHNOLOGY LTD., Sichuan (CN)

(72) Inventors: Jack Zezhong Peng, Sichuan (CN); Ke Wang, Sichuan (CN)

(73) Assignee: CHENGDU PBM TECHNOLOGY LTD., Sichuan (CN)

( * ) Notice: Subject to any disclaimer, the term of this patent is extended or adjusted under 35 U.S.C. 154(b) by 155 days.

(21) Appl. No.: 18/697,495

(22) PCT Filed: Feb. 21, 2023

(86) PCT No.: PCT/CN2023/077361
§ 371 (c)(1),
(2) Date: Apr. 1, 2024

(87) PCT Pub. No.: WO2024/130836
PCT Pub. Date: Jun. 27, 2024

(65) Prior Publication Data
US 2025/0131948 A1    Apr. 24, 2025

(30) Foreign Application Priority Data
Dec. 20, 2022 (CN) .................. 202211641027.X

(51) Int. Cl.
H10B 41/10     (2023.01)
G11C 5/06      (2006.01)

(52) U.S. Cl.
CPC .................. G11C 5/063 (2013.01)

(58) Field of Classification Search
CPC .................................. H10B 41/10
See application file for complete search history.

(56) References Cited

U.S. PATENT DOCUMENTS 8,310,864 B2    11/2012    Lung et al.
9,065,044 B2    6/2015     Scheuerlein
(Continued)

FOREIGN PATENT DOCUMENTS

| CN | 102290428 A | 12/2011 |
| CN | 102543877 A | 7/2012 |
| CN | 115101479 A | 9/2022 |

OTHER PUBLICATIONS

International Search Report mailed Jun. 15, 2023, in connection with International Patent Application No. PCT/CN2023/077361, 7 pgs (including translation).
(Continued)

Primary Examiner — Hoai V Ho
(74) Attorney, Agent, or Firm — Chiesa Shahinian & Giantomasi PC

(57) ABSTRACT

Provided are an underlying transistor circuit of a semiconductor memory and a preparation method for the same. The circuit includes a row line layer, a column line layer positioned above the row line layer, and an insulating isolation layer between the row line layer and the column line layer, with directions of the row lines and the column lines being perpendicular to each other. Holes penetrating the column line layer and the insulating isolation layer are provided at intersections of row lines and column lines; upper and lower segments of the hole are both filled with semiconductor materials; the semiconductor material in the upper segment of the hole has a doping type the same as that of the row line, while the semiconductor material in the lower segment of the hole has a doping type opposite to that of the row line, thus, a transistor is formed in each hole.

5 Claims, 5 Drawing Sheets

(56) References Cited

U.S. PATENT DOCUMENTS

| | | |
|---|---|---|
| 9,070,872 B2 | 6/2015 | Huo et al. |
| 2002/0096689 A1 | 7/2002 | Nemati et al. |
| 2002/0149084 A1* | 10/2002 | Tamaki ............ H01L 21/76264 |
| | | 438/296 |
| 2011/0305074 A1 | 12/2011 | Lung et al. |
| 2013/0203227 A1 | 8/2013 | Huo et al. |
| 2014/0239244 A1 | 8/2014 | Pellizzer et al. |
| 2018/0277445 A1 | 9/2018 | Gluschenkov et al. |

OTHER PUBLICATIONS

Wang et al., "Three-Dimensional 4F2 ReRAM Cell with CMOS Logic Compatible Process," 2010 International Electron Devices Meeting, pp. 29.6.1-29.6.4.

* cited by examiner

UNDERLYING TRANSISTOR CIRCUIT OF SEMICONDUCTOR MEMORY AND PREPARATION METHOD FOR THE SAME

This application is a National Stage application under 35 U.S.C. 371 of International Patent Application No. PCT/CN2023/077361, filed Feb. 21, 2023, which claims the benefit and priority of Chinese Patent Application No. 202211641027.X, filed Dec. 20, 2022; the disclosures of all of which are incorporated herein by reference in their entireties.

TECHNICAL FIELD

The present disclosure relates to integrated circuit technologies, and in particular, to a semiconductor memory technology.

BACKGROUND

Current 3D memories, such as NAND, resistance random access memory, and phase-change memory, typically use planar process fabricated metal oxide semiconductor (MOS) transistors as select transistors for vertical bit lines of 3D memories. Since the critical dimensions and occupied area of MOS select transistors need to be compatible with densely packed 3D memory arrays, the use of MOS select transistors with dimensions limited by planar processes can cause the subsequently stacked 3D memories to occupy a large chip area. Another type of select transistor is a vertical MOS select transistor (Wang et al., IEEE (2012)) or a vertical bipolar junction transistor (BJT) select transistor (Wang et al., IEEE (2010)). The vertical MOS select transistor disposed under the 3D memory array is prepared under an active area of the substrate. As a result, other essential peripheral circuits (such as input/output (I/O) circuits and control circuits) can only be placed outside the 3D memory array that occupies most of the chip area, which further occupies a portion of the chip area. A vertical MOS select transistor positioned on top of the substrate rather than under the substrate (U.S. Pat. No. 9,065,044 B2) avoids the aforementioned issues but requires a complex and difficult-to-control high-temperature annealing process for out-diffusion of the heavily-doped source into lightly-doped MOS channels of different conductivity types, leading to higher manufacturing costs.

SUMMARY

The technical problem to be solved by the present disclosure is to provide an underlying transistor circuit of a semiconductor memory and a preparation method for the same, achieving low costs and high reliability.

The technical solution adopted to address the technical problem in the present disclosure is an underlying transistor circuit of a semiconductor memory, including a row line layer, a column line layer positioned above the row line layer, and an insulating isolation layer between the row line layer and the column line layer.

A predetermined number of row lines made of a doped semiconductor material are arranged in the row line layer.

The column line layer includes an insulating material and a predetermined number of column lines arranged in the insulating material, and the column lines are made of a conductive material.

Directions of the row lines and the column lines are perpendicular to each other. Holes penetrating the column line layer and the insulating isolation layer are provided at intersections of the row lines and the column lines.

Upper and lower segments of the hole are both filled with semiconductor materials. The semiconductor material in the upper segment of the hole has a doping type the same as that of the row line, while the semiconductor material in the lower segment of the hole has a doping type opposite to that of the row line, and a transistor is formed in each hole. Between the semiconductor material in the upper segment of the hole and the material of the row line, one meets the requirements of a collector region of the transistor, while the other meets the requirements of an emitter region of the transistor; the semiconductor material in the lower segment of the hole meets requirements of a base region of the transistor.

The semiconductor material in the lower segment of the hole is in contact with the column line and also in contact with the row line at the bottom of the hole.

Furthermore, the hole is rectangular, elliptical, or circular.

The column lines are made of a doped semiconductor material, metal silicide, or a metal conductive material.

A preparation method for an underlying transistor circuit of a semiconductor memory provided by the present disclosure includes the following steps:

(1) setting a row line layer on a bottom basic circuit layer, where the row line layer has a predetermined number of parallel row lines made of a doped semiconductor material;

(2) covering the row line layer with an insulating isolation layer, and then setting a column line layer on the insulating isolation layer, where the column line layer includes an insulating material and a predetermined number of parallel column lines provided within the insulating material, the column lines being perpendicular to the row lines and made of a conductive material;

(3) forming holes at intersections of the row lines and the column lines, wherein the holes penetrate the column line layer and the interlayer insulating isolation layer, the bottom of the hole exposes the row line, and an opening of the hole is located on an upper surface of the column line layer; and (4) filling a lower segment of the hole with a semiconductor material of a doping type opposite to that of the row line, and then filling an upper segment of the hole with a semiconductor material of a doping type the same as that of the row line, where a bottom surface of the semiconductor material in the upper segment of the hole is higher than a top surface of the column line.

Further, the method includes the following step: connecting each row line and each column line to the bottom basic circuit layer, and connecting the material in the upper segment of the hole to vertical bit lines of an upper multi-layer stacked memory array.

The "opposite doping type" mentioned in the present disclosure pertains to two doping types: P-type doping and N-type doping. If two materials are both of N-type doping or P-type doping, the materials are considered to have the same doping type. If one material is of N-type doping and the other material is of P-type doping, the materials are considered to have opposite doping types.

The underlying transistor circuit of the present disclosure can be used for selecting vertical bit lines of a 3D memory array, with a simple preparation process and low costs. The circuit of the present disclosure does not need to be prepared in an active area of the bottom substrate and can be compatible with highly integrated 3D stacked devices. Other essential peripheral circuits (such as I/O circuits and control circuits) can be placed in the active area of the bottom substrate, saving the chip area. By using vertical transistors as select transistors, the present disclosure can provide higher driving capability and operate with a low turn-on voltage. Unlike MOS transistors, the device of the present disclosure can operate without heavily relying on the optimization and precise control for the thickness of the gate oxide layer, thus having a higher tolerance for process requirements.

REFERENCE NUMERALS

201: row line
202: insulating isolation layer
203: column line
204: insulating material
1101: vertical bit line
1102: polysilicon row line
1103: polysilicon column line
1104: vertical pillar base region
1105: top vertical collector

DETAILED DESCRIPTION OF THE EMBODIMENTS

In the underlying transistor circuit of a semiconductor memory of the present disclosure, transistors at intersections of row lines and column lines are vertical transistors. A base region is vertically connected to an upper emitter region and a lower collector region. The column line serving as a base electrode, surrounds the base region and is insulated from the upper collector region and the lower emitter region (collector electrode) by an insulating material. Depending on application requirements, the emitter region can be arranged at the upper end, and the collector region can be arranged at the lower end. (Note: Since the emitter region typically has a higher doping concentration, the end with a higher doping concentration and better conductivity can naturally be used as the row line, but it is also possible to set the emitter region at the other end.) The thickness of the base region is generally 0.1 µm. Therefore, the thickness of the isolation layer should not be too large (usually less than 0.02 µm) to avoid a thin base electrode resulting in increased resistance of the base region.

Embodiment 1

Preparation Method, Referring to FIG. 2 to FIG. 12

Figure 1:
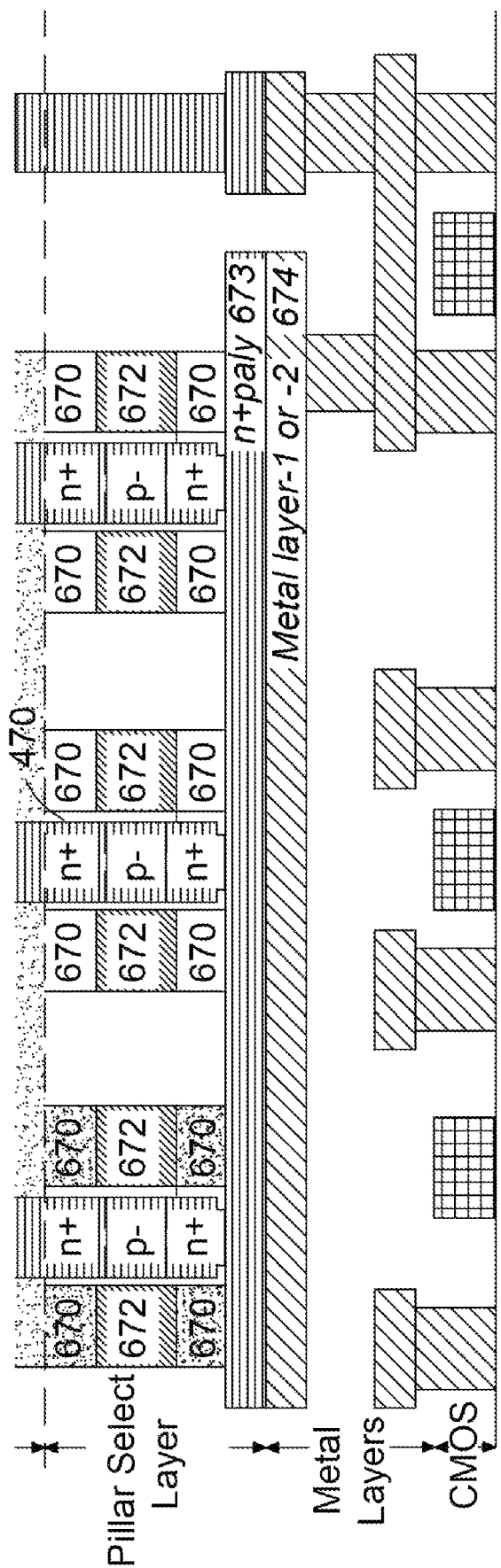
FIG. 1 illustrates the principle of U.S. Pat. No. 9,065,044B2.
Figure 2:
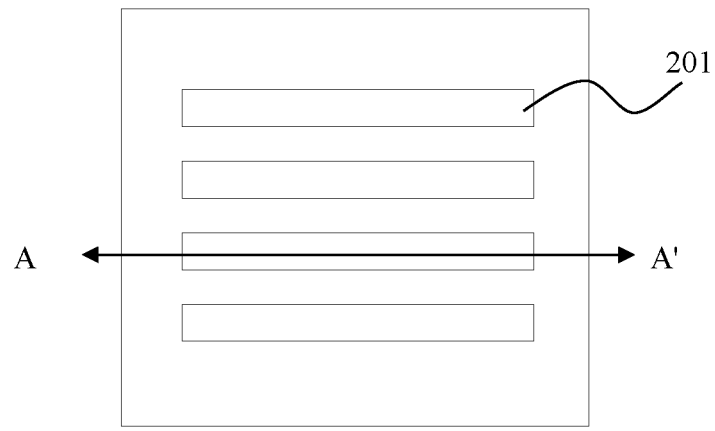
FIG. 2 is a top view of step (1) in Embodiment 1.
Figure 3:
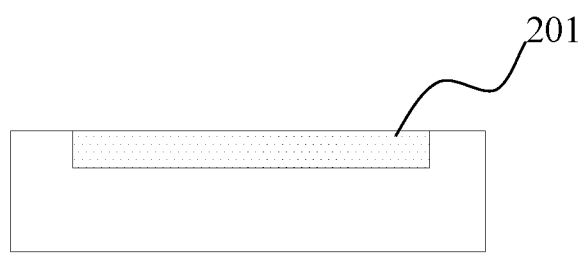
FIG. 3 is a sectional view taken along A-A' (longitudinal section) of step (1) in Embodiment 1.
Figure 4:
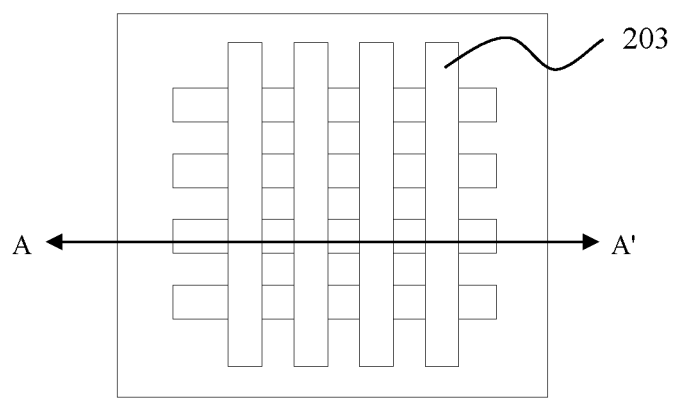
FIG. 4 is a top view of step 2a in Embodiment 1.
Figure 5:
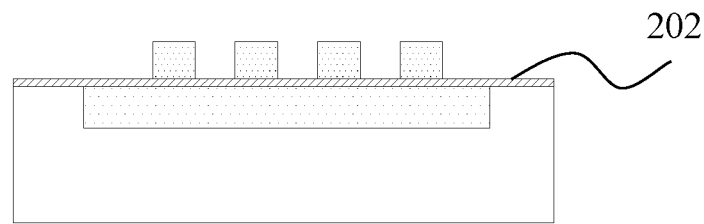
FIG. 5 is a sectional view taken along A-A' of step 2a in Embodiment 1.
Figure 6:
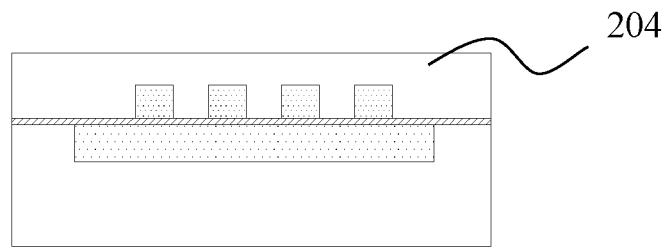
FIG. 6 is a longitudinal section view of step 2b in Embodiment 1.
Figure 7:
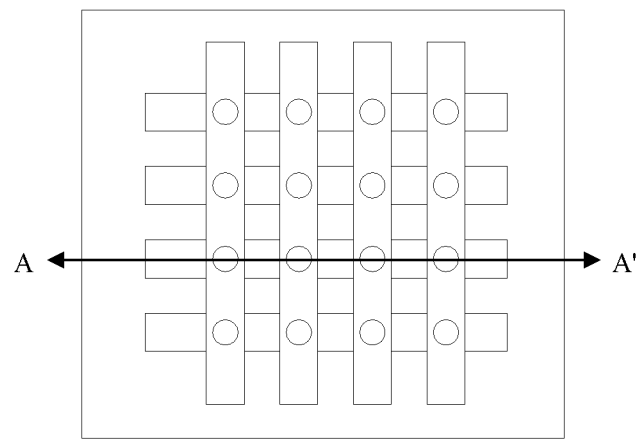
FIG. 7 is a top view of step (3) in Embodiment 1.
Figure 8:
FIG. 8 is a sectional view taken along A-A' of step (3) in Embodiment 1.
Figure 9:
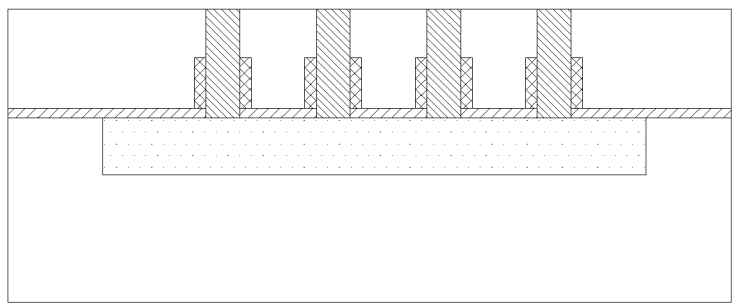
FIG. 9 is a longitudinal section view of step (4) in Embodiment 1.

This embodiment includes the following steps:
(1) Set a row line layer on a bottom basic circuit layer, where the row line layer has a predetermined number of parallel row lines 201 made of a doped low-resistance semiconductor material, as shown in FIG. 2 and FIG. 3.
(2) Cover an insulating isolation layer 202 on the row line layer, and then setting a column line layer on the insulating isolation layer through the following steps (2a) and (2b):
2a: Set a predetermined number of parallel column lines 203 on an upper surface of the insulating isolation layer 202, where the column lines are perpendicular to the row lines and are made of a conductive material, as shown in FIG. 4 and FIG. 5.
2b: Cover the column lines with an insulating material 204, as shown in FIG. 6.
(3) Form holes at intersections of the row lines and the column lines, where the holes penetrate the column line layer and the insulating isolation layer, the bottom of the hole exposes the material of the row line, and an opening of the hole is located on an upper surface of the column line layer, as shown in FIG. 7 and FIG. 8.
(4) Fill a lower segment of the hole with a semiconductor material of a doping type opposite to that of the row line, as shown in FIG. 9.
(5) Fill an upper segment of the hole with a semiconductor material of a doping type the same as that of the row line (inject impurities of a conductivity type the same as that of the row line into the upper segment of the hole) (note: in FIG. 9, since the entire channel has been filled, impurities need to be injected into the upper region such that the upper segment is filled with a semiconductor material of a different conductivity type; if the original filler is employed in this step to form the upper structure, the upper segment can be empty in FIG. 9; both approaches are feasible), where the bottom surface of the semiconductor material in the upper segment of the hole is higher than the top surface of the column line, as shown in FIG. 10.

Embodiment 2

Figure 10:
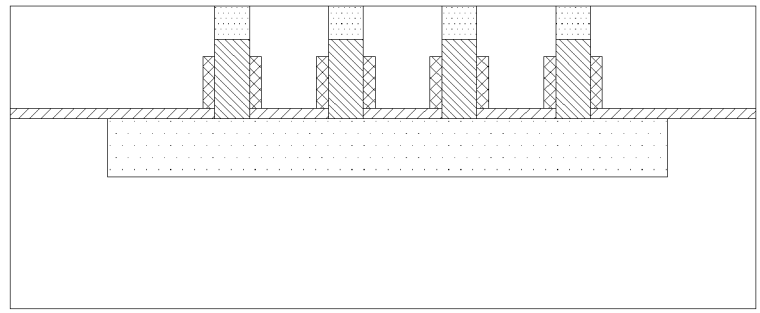
FIG. 10 is a longitudinal section view of step (5) in Embodiment 1.

Refer to FIG. 10

An underlying transistor circuit of a semiconductor memory of the present disclosure includes a row line layer, a column line layer positioned above the row line layer, and an insulating isolation layer between the row line layer and the column line layer.

A predetermined number of row lines made of a doped low-resistance semiconductor material are arranged in the row line layer.

The column line layer includes an insulating material and a predetermined number of column lines arranged in the insulating material and made of a conductive material.

Directions of the row lines and the column lines are perpendicular to each other. Holes penetrating the column line layer and the insulating isolation layer are provided at intersections of the row lines and the column lines.

Upper and lower segments of the hole are both filled with semiconductor materials. The semiconductor material in the upper segment of the hole has a doping type the same as that of the row line, while the semiconductor material in the lower segment of the hole has a doping type opposite to that of the row line, forming a transistor in each hole. Between the semiconductor material in the upper segment of the hole and the material of the row line, one meets the requirements of a collector region of the transistor, while the other meets the requirements of an emitter region of the transistor; the semiconductor material in the lower segment of the hole meets the requirements of a base region of the transistor.

The semiconductor material in the lower segment of the hole is in contact with the column line and also in contact with the row line at the bottom of the hole.

Figure 12:
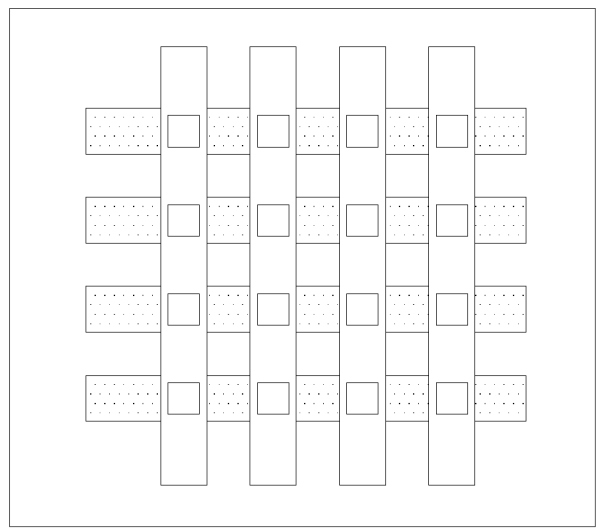
FIG. 12 is a top view of an embodiment with rectangular holes.

FIG. 12 illustrates an implementation with rectangular holes.

Embodiment 3

Figure 11:
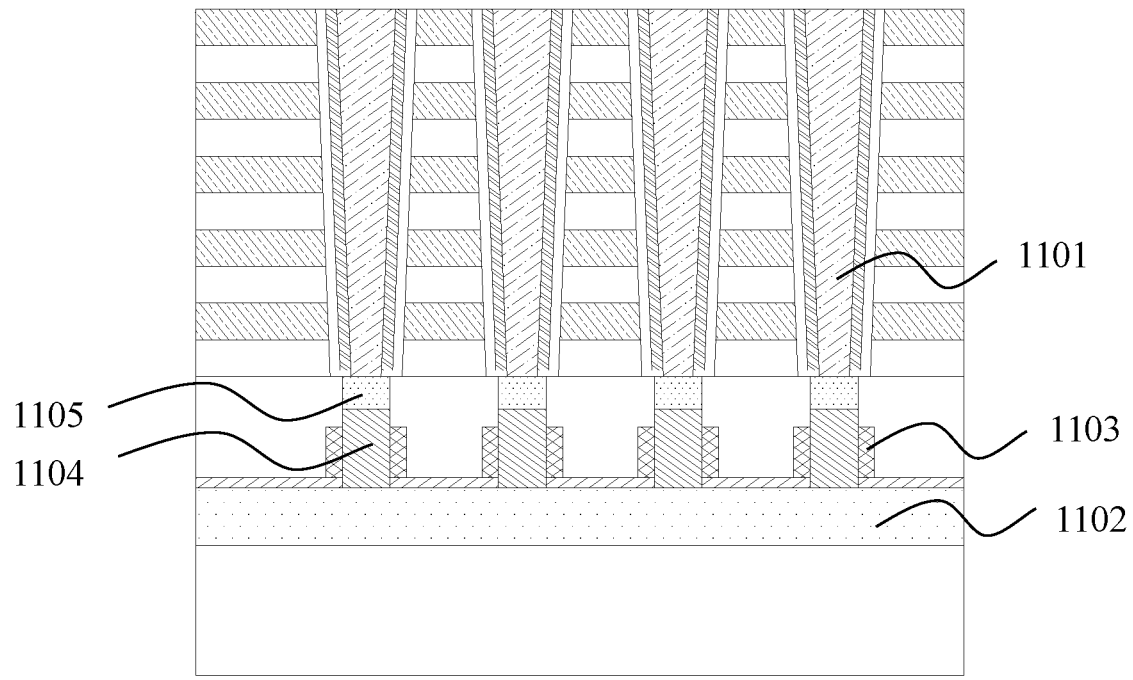
FIG. 11 is a schematic structural diagram of Embodiment 3 of the present disclosure.

Refer to FIG. 11. Embodiment 2 is used as an underlying selection circuit of a three-dimensional semiconductor memory, an emitter is connected to vertical bit lines 1101 of three-dimensional stacked memory cells.

This embodiment consists of the upper three-dimensional memory and lower parts:
(1) polysilicon row lines 1102 (N+ or P+) serving as a collector electrode at the bottom;
(2) polysilicon column lines 1103 (P+ or N+) above the polysilicon row lines, serving as a base electrode,
(3) a vertical pillar base region 1104 (P− or N− lightly doped) surrounded by the polysilicon column lines 1103, and
(4) a top vertical collector electrode 1105 (N+ or P+) connected to the vertical bit lines of the three-dimensional stacked memory cell.

What is claimed is:

1. An underlying transistor circuit of a semiconductor memory, comprising a row line layer, a column line layer positioned above the row line layer, and an insulating isolation layer between the row line layer and the column line layer,
wherein a predetermined number of row lines made of a doped semiconductor material are arranged in the row line layer;
the column line layer comprises an insulating material and a predetermined number of column lines arranged in the insulating material and made of a conductive material;
directions of the row lines and the column lines are perpendicular to each other, and holes penetrating the column line layer and the insulating isolation layer are provided at intersections of the row lines and the column lines;
upper and lower segments of the hole are both filled with semiconductor materials; the semiconductor material in the upper segment of the hole has a doping type the same as that of the row line, while the semiconductor material in the lower segment of the hole has a doping type opposite to that of the row line, a transistor is formed in each hole; one of the semiconductor material in the upper segment of the hole and the material of the row line meets requirements of a collector region of the transistor, while the other meets requirements of an emitter region of the transistor; the semiconductor material in the lower segment of the hole meets requirements of a base region of the transistor; and
the semiconductor material in the lower segment of the hole is in contact with the column line and also in contact with the row line at a bottom of the hole.

2. The underlying transistor circuit of a semiconductor memory according to claim 1, wherein the holes are rectangular.

3. The underlying transistor circuit of a semiconductor memory according to claim 1, wherein the column lines are made of a doped semiconductor material.

4. A preparation method for an underlying transistor circuit of a semiconductor memory, comprising the following steps:
(1) setting a row line layer on a bottom basic circuit layer, wherein the row line layer has a predetermined number of parallel row lines made of a doped semiconductor material;
(2) covering the row line layer with an insulating isolation layer, and then setting a column line layer on the insulating isolation layer, wherein the column line layer comprises an insulating material and a predetermined number of parallel column lines provided within the insulating material, the column lines being perpendicular to the row lines and made of a conductive material;
(3) forming holes at intersections of the row lines and the column lines, wherein the holes penetrate the column line layer and an interlayer insulating isolation layer, a bottom of the hole exposes the row line, and an opening of the hole is located on an upper surface of the column line layer; and
(4) filling a lower segment of the hole with a semiconductor material of a doping type opposite to that of the row line, and then filling an upper segment of the hole with a semiconductor material of a doping type the same as that of the row line, wherein a bottom surface of the semiconductor material in the upper segment of the hole is higher than a top surface of the column line.

5. The preparation method for an underlying transistor circuit of a semiconductor memory according to claim 4, further comprising the following step:
connecting each row line and each column line to the bottom basic circuit layer.

* * * * *